US005150086A

United States Patent [19]

Ito

[11] Patent Number: 5,150,086

[45] Date of Patent: Sep. 22, 1992

[54] FILTER AND ELECTRICAL CONNECTOR WITH FILTER

[75] Inventor: Tsukasa Ito, Omiya, Japan

[73] Assignee: AMP Incorporated, Harrisburg, Pa.

[21] Appl. No.: 732,380

[22] Filed: Jul. 18, 1991

[30] Foreign Application Priority Data

Jul. 20, 1990 [JP] Japan .................................. 2-190606

[51] Int. Cl.[5] .............................................. H03H 7/04

[52] U.S. Cl. .................................... 333/182; 333/181; 333/185; 361/302; 361/312

[58] Field of Search ............... 333/182, 184, 185, 181, 333/167, 183; 361/302, 312, 329, 301

[56] References Cited

U.S. PATENT DOCUMENTS 4,144,509 3/1979 Boutros .............................. 333/181
4,682,129 7/1987 Bakermans et al. ................ 333/184
4,761,147 8/1988 Gauthier ............................ 439/607
4,791,391 12/1988 Linnell et al. ....................... 333/184
4,853,659 8/1989 Kling .................................. 333/184
4,931,754 6/1990 Moussie .............................. 333/184
4,992,060 2/1991 Meyer ................................ 439/620

*Primary Examiner*—Eugene R. LaRoche
*Assistant Examiner*—Ali Neyzari
*Attorney, Agent, or Firm*—Adrian J. LaRue

[57] ABSTRACT

An electrical filter connector comprises a metal shell (10,18) in which is secured a dielectric housing (8) having electrical contacts (6,6′,6″) secured therein, a filter member (30,50,70) electrically connected to the metal shell and having a plate member (34,52,72) provided with a multiplicity of through holes (32,54,74) with capacitors (42,56,80) at each through hole, and post members (6a,6a′,6a″) of the contacts disposed in the through holes and electrically connected to the capacitors thereat.

9 Claims, 3 Drawing Sheets

FILTER AND ELECTRICAL CONNECTOR WITH FILTER

FIELD OF THE INVENTION

This invention relates to filters and electrical connectors with built-in filters suitable for eliminating high-frequency noise occurring in electronic circuitry of such devices as personal computers and the like.

BACKGROUND OF THE INVENTION

The operation of personal computers and other electronic devices is usually accompanied by high-frequency noise generated in the same device or transmitted from other apparatus. Among various methods proposed to solve this problem, that is, to eliminate high-frequency noise, the use of filters is one of the best known. Recent trends toward reducing the size and cost of electronic devices have had an influence on the filter design as well. An example of a filter design in accordance with such requirements is shown in FIG. 5, U.S. Pat. No. 4,791,391. This filter 100, as shown in FIG. 5, is built on alumina substrate 106 which has a through hole 104 through which passes contact 102 of an electrical connector; it is formed by the thick-film capacitor 116 consisting of lower electrode 110 connected to metal shell 108 of the electrical connector, dielectric layer 112, and upper electrode 114 soldered to contact 102. This filter can remove from the signal high-frequency noise passing along contact 102 by diverting it through the thick-film capacitor 116 to shell 108. Layers 110, 112, 114 which make up the capacitor 116 arm applied by screen printing technique. They can be made in sufficiently small sizes and at reasonably low cost.

However, since the dielectric layer 112 of filter 100 covers almost the entire surface of the alumina substrate 106 except for the through hole 104, the dielectric layer is shared by all contacts 102 passing through the alumina substrate 106. Therefore, portions of the dielectric layer common to the adjacent contacts 102 create a parasitic capacitance. This phenomenon becomes especially noticeable with the reduction of the connector size which results in an increased contact density. The increase in density of contacts 102, in turn, leads to a decrease in a capacitance of the thick-film capacitor, to an increase in the parasitic capacitance, and to signal leaks or crosstalk between adjacent contacts due to the increase in intercontact capacitance.

The purpose of this invention is to provide a filter and a connector with filter satisfying the small size and low cost requirements and, at the same time, eliminating crosstalk.

SUMMARY OF THE INVENTION

The filters of a first type in accordance with this invention are characterized by the fact that they involve capacitors formed independently on at least one surface of a plate with a number of through holes and comprising a first conductive layer, a dielectric layer and a second conductive layer.

The filters of a second type in accordance with this invention are characterized by the fact that they involve capacitors formed independently inside the through holes of a plate with a number of through holes and comprising at least a conductive layer formed on the internal surface of the through hole, a dielectric layer formed inside the through hole which is in contact with at least a part of the conductive layer formed inside the through hole, and a conductive layer forming a capacitor together with the dielectric layer and conductive layer.

Electrical connectors in accordance with this invention having filters of the first type are characterized in that they have a number of contacts, an insulating housing retaining the contacts, a filter with a number of through holes in a plate through which the contacts pass, and an electrical connector having a conductive shield connected to the filters involving independent capacitors formed by and including a conductive layer formed on the plate and at least on the internal surface of the through holes, a dielectric layer formed on the inside wall of the through holes and being in contact with at least a portion of the conductive layer, and a second conductive layer applied to at least one surface of the plate around the through holes.

Electrical connectors in accordance with this invention having filters of the second type are characterized by the fact that they have a number of contacts, an insulating housing retaining the contacts, filters with a number of through holes in a plate through which the contacts pass, and an electrical connector having a conductive shield connected to the filters involving independent capacitors formed by and including a conductive layer formed on the plate and at least on the internal surface of the through holes, a dielectric layer formed on the inside wall of the through holes and being in contact with at least a portion of the conductive layer, and a second conductive layer applied to at least one surface of the plate around the through holes.

Since individual thick-film capacitors do not have a common dielectric layer, the use of filters of the first and second types results in an extremely low parasitic capacitance between them even at high densities of contacts. The parasitic capacitance between the contacts of the electrical connectors incorporating such filters will therefore be very low as well, and the leakage of the signals transmitted through these contacts will be eliminated, thereby sharply reducing the crosstalk. On the other hand, the high-frequency noise is grounded via thick-film capacitors to the conductive shield.

BRIEF DESCRIPTION OF THE DRAWINGS

The invention is best understood by way of example with reference to the following detailed description in conjunction with the accompanying drawings.

DETAILED DESCRIPTION OF THE INVENTION

Figure 1:
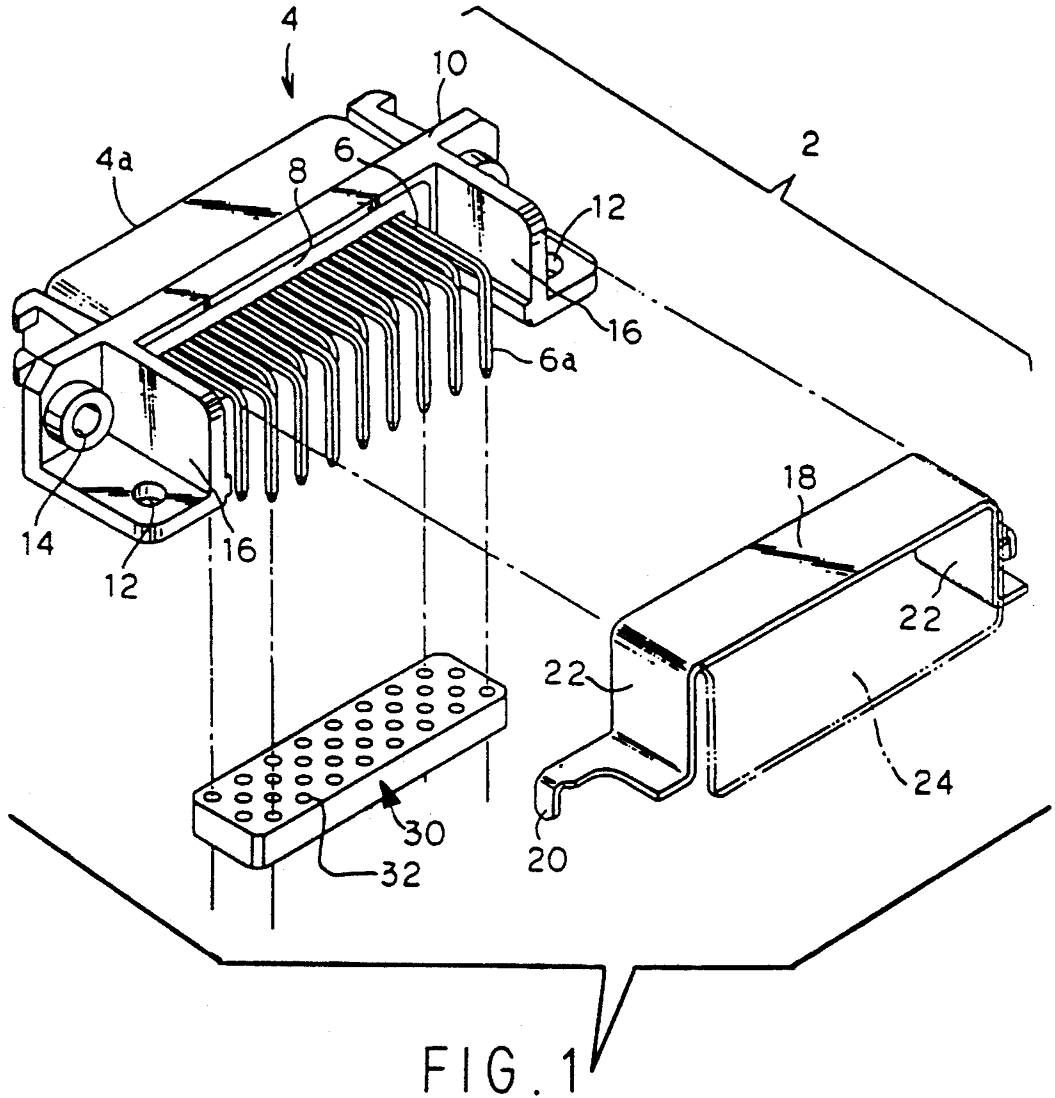
FIG. 1 is an exploded perspective view of an embodiment of a connector with filters of a first type in accordance with this invention.

In FIG. 1, the connector 2 includes a connector body 4 incorporating contacts 6, insulating housing 8 and metal shell 10, conductive plate 18 and filter 30. The contacts 6 secured in the insulating housing 8 extend to the front side *4a* of the connector body 4 for connection to a matable connector (not shown), and to the back side of insulating housing 8 in the form of posts 6*a*. The shell 10 is made of metal, and it is positioned onto the housing 8. On either side of the shell 10 there are the openings 12, 14 for screws to attach the connector to a panel (not shown) or to a printed circuit board (not shown). The conductive plate 18 is secured between the walls 16, 16 of the shell 10 and includes protrusions 20 on both sides for insertion into the grounding pattern of a PC board. The filter 30 has through holes 32 for receiving posts 6*a* of the contacts 6, and is soldered on both sides longitudinally to the walls 22 conductive plate 18.

Figure 2:
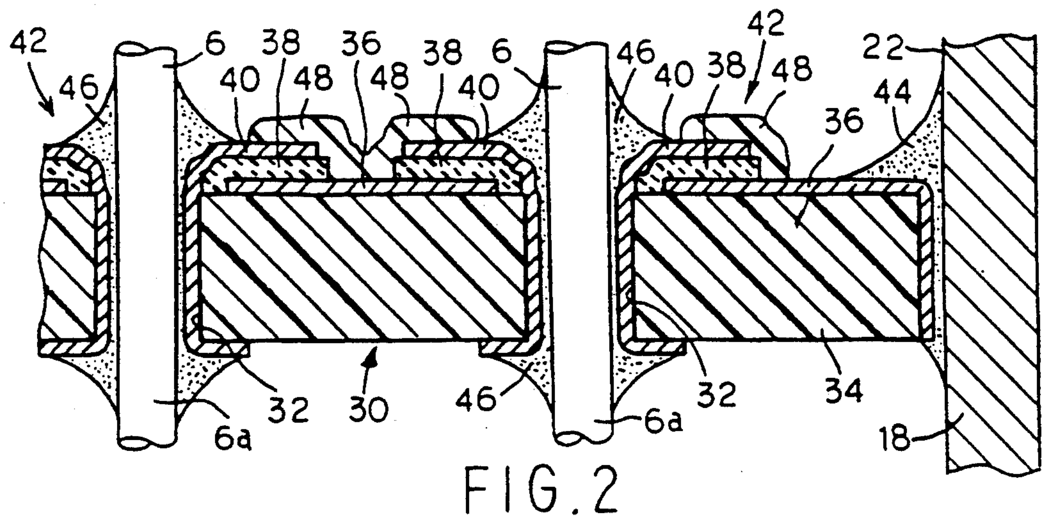
FIG. 2 is an enlarged cross sectional view of part of the connector shown in FIG. 1.

In FIG. 2, the filter 30 has a thick-film capacitor 42 formed on the plate 34 of magnetic material (preferably ferrite) or a dielectric material by first conductive layer 36, dielectric layer 38 and second conductive layer 40. The conductive layer 36 covers the side surfaces and almost the entire top surface of plate 34 except for the areas around the through holes 32. Portions of the first conductive layer 36 is formed on the side surfaces of plate 34 are soldered by solder 44 to the side walls of the conductive plate 18 thus forming an electrical connection with such plate. The dielectric layer 38 is shaped as a doughnut around each through hole 32 so as to straddle over the plate 34 and the first conductive layer 36. The second conductive layer 40 is formed on the top of dielectric layer 38, inside the through hole 32 and on the bottom surface of plate 34 around the through hole 32, and it is connected to the post 6*a* of contact 6 by solder 46. A sealing layer of glass 48 over each thick-film capacitor 42 is also desirable to improve resistance to moisture.

Filters 30 are made in accordance with the following manufacturing process. Initially, a paste for the first conductive layer 36 is applied to the surface of the plate 34 by screen printing, then it is dried and baked at an appropriate temperature, for example 850° C. Next, a paste for the dielectric layer 38 is applied also by screen printing, dried and baked in a similar manner as the first conductive layer. As it is difficult to obtain a dielectric layer 38 of sufficient electric strength in just one application, it is desirable to repeat this process several times. The second conductive layer 40 is also obtained by screen printing using for example a vacuum pump to draw the paste inside the through holes 32. Finally, a paste for sealing the glass layer 48 is applied by the screen printing method, then it is dried and baked at an appropriate temperature, for example 510° C.

By incorporating the filter 30 manufactured by this press into the connector, it becomes possible to eliminate the high-frequency noise transmitted via the contacts 6 by rerouting it to the ground pattern on the PC board through the thick-film capacitors 42 and the conductive plate 18. Since the dielectric layers 38 of the thick-film capacitors 42 are made individually for each through hole 32, the parasitic capacitance between the contact 6 is extremely low, which results in successful suppression of crosstalk between the contact 6.

In the above embodiment, the first conductive layer 36 is formed on the surface of the plate 34 except around the through holes 32. There is no need, though, to cover almost the entire areas; the first conductive layer 36 can also be made in the same pattern as the dielectric layer 38 with leads to the conductive plate 18.

Another feature of the connector in accordance with this embodiment with an enhanced shielding effect was implemented by adding the back wall 24 to the conductive plate 18 as shown in FIG. 1. If shielding is not a problem as far as the external elements are concerned, one can dispense with the conducting plate 18 altogether. In this case, both sides of the filter 30 will be electrically connected to the walls 16 of the shell 10 and grounded by means of screws passing through the openings 12 to the grounding pattern of the PC board. If thick-film capacitors 42 are provided on both surfaces of a ferrite plate 34, a pi-type filter is obtained. If this is the case, it is not necessary to apply the second conductive layer 40 to the internal walls of the through holes 32.

In the above embodiment, the second conductive layer 40 of the thick-film capacitor 42 was formed above the first conductive layer 36; however, these positions can be reversed, that is the first conductive layer can be formed above the second conductive layer.

Figure 3:
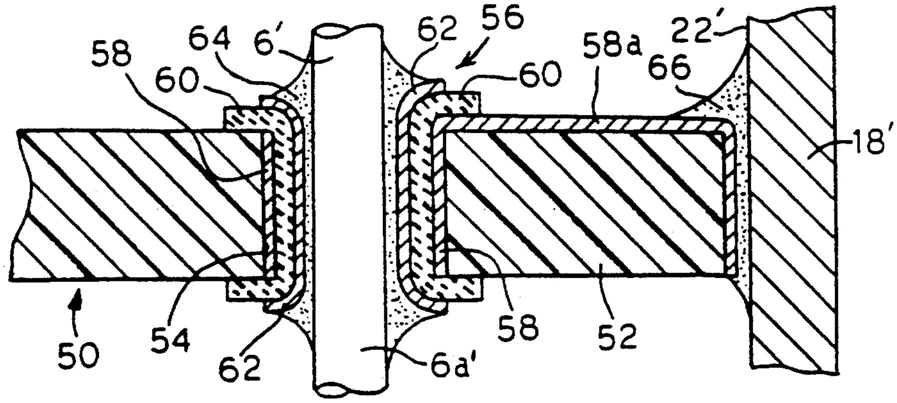
FIGS. 3 and 4 are enlarged cross sectional views like FIG. 1 of embodiments of a connector in accordance with this invention, equipped with other types of filters.
Figure 4:
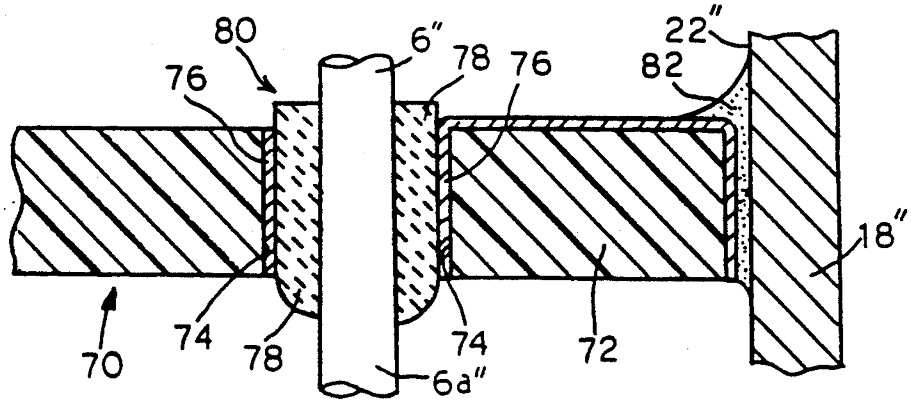
Figure 5:
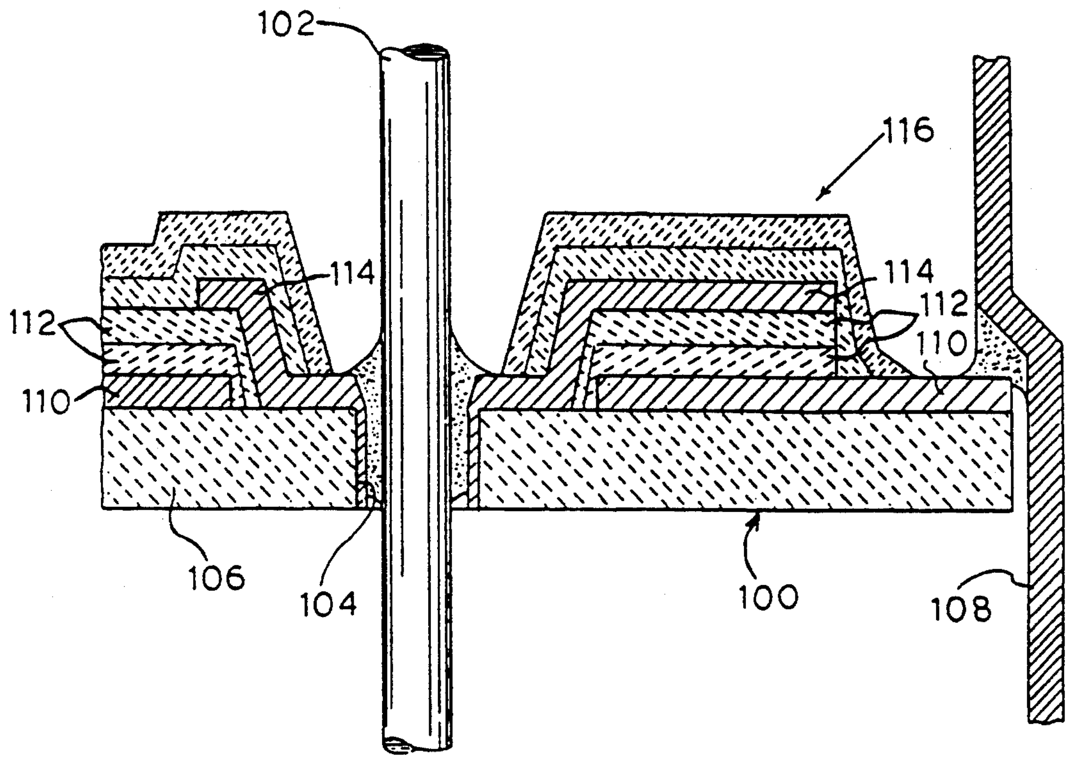
FIG. 5 Prior Art
FIG. 5 is an enlarged cross-sectional view of part of a connector with a conventional filter.

FIGS. 3 and 4 are enlarged cross-sections of embodiments of a connector in accordance with this invention equipped with a filter of other types.

In FIG. 3, the filter 50 includes a plate 52 made of a ferrite or other magnetic material (or of a dielectric material) and the capacitors 56 are formed in the through holes 54 in the plate 52. Each capacitor 56 comprises a conductive layer 58 formed on the internal surface of the through holes 54, a dielectric layer 60 covering the conductive layer 58 formed inside the through holes 54 and the upper and lower surfaces of the plate 52, and of the conductive layers 62 located inside the through holes 54 so as to be in contact with the dielectric layer 60. The conductive layers 62 are connected to posts 6*a*′ of the contacts 6′ by means of the solder 64, and the conductive layers 58 of another through hole 54 by means of the conductive strip 58*a*, thus connecting all capacitors 56 to the conductive plate 18′ by solder 66. Since each capacitor 56 is being formed in the individual through holes 54, the parasitic capacitance between two adjacent capacitors 56 is extremely low, thus enabling not only elimination of the crosstalk between the contacts 6′, but also to reduce the pitch between these contacts, thereby increasing the density of the contacts.

In addition, if the inside diameter of the dielectric layer 60 is almost the same as the outside diameter of the contact 6′, the contacts 6′ can serve as a second conductive plate of the capacitor, eliminating thus the need for the conductive layer 62 and soldering, thereby greatly increasing the productivity.

As can be seen from FIG. 4, the filter 70 can also be produced by forming a conductive layer 76 on the internal surface of all through holes 74 of the plate 72, and by inserting the contacts 6″ with the dielectric layer 78 applied to their inserted portions of posts 6*a*″, thus constructing a capacitor 80 including conductive layer 76, dielectric layer 78 and the contact 6″. Naturally, in such a case, the inside diameter of the conductive layer 76 in the through hole 74 must be almost the same as the outside diameter of the dielectric layer 78.

As has been explained in detail above, the filters and connectors with filters according to this invention permit greatly reducing parasitic capacitance between individual thick-film capacitors due to the fact that the dielectric layers are made individually for each thick-film capacitor. As a result of such an arrangement an effective suppression of crosstalk between contacts becomes feasible.

Since the filters in accordance with the present invention are equipped with thick-film capacitors, they are of the miniature flat type, and since no assembly is involved in mounting the capacitor elements, the cost of production is considerably lower.

The use of a ferrite or dielectric material for the plate of the filters or connectors with filters, in accordance with this invention, makes it possible to obtain compound LC filters, thereby totally increasing their efficiency.

Since the capacitors of the second-type filters and connectors with the second-type filters in accordance with this invention, are located inside the through holes, the pitch between the contacts can be substantially reduced, thereby greatly increasing the elements in the electric connectors.

I claim:

1. An electrical filter connector, comprising a metal shell providing a grounding path and a dielectric housing secured therein, an array of electrical contacts secured in said dielectric housing including post member of a given diameter extending outwardly from said dielectric housing providing signal paths, an inductive plate member of magnetic material having a multiplicity of through holes each of a diameter larger than the given diameter of the post members with said post members being disposed in said holes to provide an inductance to said signal path, a first metal layer on a surface of said plate member electrically connected to said shell member and ground path forming one plate of a capacitor, a capacitance material individual to each post member extending around said hole and surrounding said post member providing a capacitance C for said signal path, a second metal layer covering the surface of the said hole forming a second plate of the capacitor to define with the inductance of said plate an LC network separate for each contact to minimize parasitic capacitance between contacts and reduce cross-coupling while allowing a close center-to-center spacing of said contacts.

2. The connector of claim 1 including a third metal layer extending between said post member and said second metal layer with said capacitive material extending between the second and third layers.

3. The connector of claim 1 wherein the said capacitive material directly engages the said post member.

4. An electrical filter connector, comprising:

a dielectric housing;

electrical contacts having contact sections secured in said dielectric housing and post sections extending outwardly from a rear surface of said housing;

an inductive plate member of magnetic material having a multiplicity of through holes with said post sections extending along said holes thereby providing an inducture to signals that pass along the post sections;

a shield member extending along said housing;

a first metal layer on a surface of said plate member electrically connected to said shield member forming one plate of a capacitor;

a capacitive material individual to each post section extending around the hole thereof thereby providing a capacitance C for the signals passing along the post section;

a second metal layer covering the surface of each hole thereby forming a second plate of the capacitor to define with the inductance of said plate an LC network separate for each contact to minimize parasitic capacitance between contacts and reduce cross-coupling while allowing a close spacing of said post sections.

5. The connector of claim 4 wherein said dielectric housing is secured in a metal shell and said shield member extends along first portions of said post sections as they extend outwardly from said rear surface of said housing.

6. The connector of claim 5 wherein said shield member also extends along second portions of said post sections.

7. A filter for use with electrical connectors of a type having a plastic housing with at least one row of contacts of a given diameter spaced apart by a given spacing adapted to carry signals, a ferrite plate of inductive material having apertures of a diameter greater than said given diameter and spaced apart by a spacing compatible with the spacing of the contacts, a conductive coating extending through said apertures and over a surface of said plate to form a grounding path and one plate of a capacitor, a capacitive material extending through said aperture in contact with said conductive coating and being connected to said contact to define a capacitance C between said contact and the said conductive coating forming said grounding path, the inductance L of the ferrite plate forming, in conjunction with the capacitance C, a filter individual to each contact to minimize parasitic capacitive coupling between contacts.

8. The filter of claim 7 wherein there is a third metallic coating extending through said aperture adjacent to said contact and forming a further plate for said capacitance C.

9. The filter of claim 8 wherein said capacitive material substantially fills the volume between the said contact and the said first mentioned conductive coating and is in direct engagement with said contact.

* * * * *